(12) United States Patent
Komiyama et al.

(10) Patent No.: US 7,368,757 B2
(45) Date of Patent: May 6, 2008

(54) COMPOUND SEMICONDUCTOR AND COMPOUND SEMICONDUCTOR DEVICE USING THE SAME

(75) Inventors: Jun Komiyama, Hadano (JP);
Yoshihisa Abe, Sagamihara (JP);
Shunichi Suzuki, Hadano (JP); Hideo Nakanishi, Hadano (JP)

(73) Assignee: Covalent Materials Corporation, Tokyo (JP)

( * ) Notice: Subject to any disclaimer, the term of this patent is extended or adjusted under 35 U.S.C. 154(b) by 0 days.

(21) Appl. No.: 11/298,490

(22) Filed: Dec. 12, 2005

(65) Prior Publication Data

US 2006/0138448 A1 Jun. 29, 2006

(30) Foreign Application Priority Data

| Dec. 24, 2004 | (JP) | 2004-373506 |
| Dec. 24, 2004 | (JP) | 2004-373524 |
| Feb. 1, 2005 | (JP) | 2005-024714 |

(51) Int. Cl.
*H01L 31/0312* (2006.01)

(52) U.S. Cl. ............... 257/97; 257/94; 257/96; 257/99; 257/103; 257/57; 257/59; 257/72; 257/83; 257/257; 257/290; 257/351; 257/368; 257/392

(58) Field of Classification Search ............ 257/79, 257/94, 96, 97, 99, 103
See application file for complete search history.

(56) References Cited

U.S. PATENT DOCUMENTS 5,432,808 A * 7/1995 Hatano et al. ......... 372/45.01

6,348,704 B1 * 2/2002 Teraguchi ................ 257/197
6,765,232 B2 * 7/2004 Takahashi et al. .......... 257/79
2004/0053438 A1 * 3/2004 Abe et al. ................ 438/93

FOREIGN PATENT DOCUMENTS

| JP | 09-052798 A | 2/1997 |
| JP | 2001-177190 A | 6/2001 |
| JP | 2003-060212 A | 2/2003 |
| WO | WO 96/09653 A1 | 3/1996 |

OTHER PUBLICATIONS

S. Nishino et al., "Epitaxial Growth and Electric Characteristics of Cubic SiC on Silicon", J. Appl. Phys., vol. 61, No. 10, May 15, 1997, pp. 4889-4893.

* cited by examiner

*Primary Examiner*—Andy Huynh
*Assistant Examiner*—Tony Tran
(74) *Attorney, Agent, or Firm*—Foley & Lardner LLP

(57) ABSTRACT

A back electrode 6 is formed in the back of a Si single crystal substrate 2 of a compound semiconductor in which an n-type 3C-SiC single crystal buffer layer 3 having a thickness of 0.05-2 µm, a carrier concentration of $10^{16}$-$10^{21}$/cm$^3$, a hexagonal $In_wGa_xAl_{1-w-x}N$ single crystal buffer layer 4 ($0 \leq w < 1$, $0 \leq x < 1$, $w+x < 1$) having a thickness of 0.01-0.5 µm, and an n-type hexagonal $In_yGa_zAl_{1-y-z}N$ single crystal layer 5 ($0 \leq y < 1$, $0 < z \leq 1$, $y+z \leq 1$) having a thickness of 0.1-5 µm and a carrier concentration of $10^{11}$-$10^{16}$/cm$^3$ are stacked in order on an n-type Si single crystal substrate top 2 having a crystal-plane orientation {111}, a carrier concentration of $10^{16}$-$10^{21}$/cm$^3$, and a surface electrode 7 is formed on a surface of a hexagonal $In_yGa_zAl_{1-y-z}N$ single crystal layer 5, so as to provide a compound semiconductor device which causes little energy loss and allows an high efficiency and a high breakdown voltage.

5 Claims, 1 Drawing Sheet

COMPOUND SEMICONDUCTOR AND COMPOUND SEMICONDUCTOR DEVICE USING THE SAME

This application claims priority from Japanese Patent Application 2004-373524, filed Dec. 24, 2004, Japanese Patent Application 2004-373506, filed Dec. 24, 2004 and Japanese Patent Application 2005-024714, filed Feb. 1, 2005, all of which are incorporated herein by reference in their entirety.

TECHNICAL FIELD

The present invention relates to a compound semiconductor which is used for a short wavelength semiconductor luminescence device, a high frequency semiconductor device with a high efficiency, etc., and comprises a 3C-SiC (cubic silicon carbide) film and a compound semiconductor single crystal film, such as a nitride represented by GaN (hexagonal gallium nitride) and AlN (hexagonal aluminum nitride), etc., and a compound semiconductor device using the compound semiconductor.

BACKGROUND ART

A compound semiconductor provides an electron mobility which is considerably faster than that in silicon, and therefore is good at high-speed signal processing and has the property of operating at a low voltage, reacting to light, or emitting a microwave. From such outstanding physical properties, a device using the compound semiconductor is expected to exceed the physical-properties range of a semiconductor silicon device which is currently dominant.

Until now, for example, a Schottky barrier diode etc. is known in which a nitride-type compound-semiconductor single crystal layer is stacked on a Si substrate via a buffer layer (see Japanese Laid-open Patent No. 2003-60212).

However, in the conventional device manufactured by using the compound semiconductors mentioned above, a buffer layer comprising a compound semiconductor single crystal has a high resistance, and causes energy loss. Further, electric-field concentration occurs in an electrode, and a breakdown voltage becomes quite low compared with an ideal status, thus being hard to say that it is sufficiently practical.

Especially it is difficult for a diode which has the basic structure to be sufficiently practical, because of the energy loss due to much leakage current.

In such a conventional one as mentioned above, the high resistance is caused by a low carrier concentration of a compound semiconductor single crystal buffer layer of a nitride represented by hexagonal GaN, hexagonal AlN, etc. It is, however, physically difficult to increase the carrier concentration in such a buffer layer.

Further, the improvement in reducing the electric-field concentration in the electrode is not sufficiently achieved, either.

DISCLOSURE OF THE INVENTION

Therefore, in a compound semiconductor, in order to fully take advantage of the outstanding property as mentioned above and to expand the use, an improvement in reducing the leakage current and increasing the breakdown voltage is required.

The present invention is made in order to solve the above-mentioned technical problem, and aims to provide a compound semiconductor which causes little energy loss and has a high efficiency and a high breakdown voltage, and a compound semiconductor device using the compound semiconductor.

A compound semiconductor in accordance with the present invention is characterized in that an n-type 3C-SiC single crystal buffer layer having a thickness of 0.05-2 μm at a carrier concentration of $10^{16}$-$10^{21}$/cm$^3$, a hexagonal $In_wGa_xAl_{1-w-x}N$ single crystal buffer layer having a thickness of 0.01-0.5 μm ($0 \leq w<1$, $0 \leq x<1$, $w+x<1$), and an n-type hexagonal $In_yGa_zAl_{1-y-z}N$ single crystal layer ($0 \leq y<1$, $0<z \leq 1$, $y+z \leq 1$) having a thickness of 0.1-5 μm at a carrier concentration of $10^{11}$-$10^{16}$/cm$^3$ are stacked in order on an n-type Si single crystal substrate of a crystal-plane orientation {111} at a carrier concentration of $10^{16}$-$10^{21}$/cm$^3$.

According to the compound semiconductor as mentioned above, by employing the crystal-plane orientation {111}, generation of an anti-phase boundary defect is reduced and the electric-field concentration in the defect can be eased, so that the breakdown voltage can be increased to 1.5 times a conventional one. Further, since the 3C-SiC single crystal buffer layer can increase the carrier concentration, the resistance can be substantially halved compared with a conventional one when energized.

In the above-mentioned compound semiconductor, it is preferable that an n-type c-BP (cubic boron phosphide) single crystal buffer layer having a thickness of 0.01-1 μm at a carrier concentration of $10^{16}$-$10^{21}$/cm$^3$ is inserted and formed between the above-mentioned Si single crystal substrate and 3C-SiC single crystal buffer layer.

The insertion and formation of the c-BP single crystal buffer layer can further increase the carrier concentration of the 3C-SiC single crystal buffer layer. When energized, the resistance can be reduced to approximately ⅕ compared with the conventional one.

Further, in the above-mentioned compound semiconductor, it is preferable that the above-mentioned hexagonal $In_wGa_xAl_{1-w-x}N$ single crystal buffer layers is the hexagonal AlN (w=0, x=0) and the above-mentioned hexagonal $In_yGa_zAl_{1-y-z}N$ single crystal layer is the hexagonal GaN (y=0, z=1).

The 3C-SiC single crystal buffer layer, the hexagonal AlN, and the hexagonal GaN change stepwise in lattice constant and have small lattice mismatch, so that misfit dislocation can be reduced, the electric-field concentration to misfit dislocation is reduced, and the breakdown voltage can be doubled compared with the conventional one.

Further, the compound semiconductor device in accordance with the present invention is characterized in that a back electrode is formed in the back of such a Si single crystal substrate of the compound semiconductor mentioned above, and a surface electrode is formed on a surface of the hexagonal $In_yGa_zAl_{1-y-z}N$ single crystal layer.

Preferably, each of the above-mentioned back electrode and surface electrode is formed of a metal including at least one of Al, Ti, In, Au, Ni, Pt, W, and Pd, the back electrode is an ohmic junction, the surface electrode is a Schottky junction, and the above-mentioned 3C-SiC single crystal buffer layer, the hexagonal $In_wGa_xAl_{1-w-x}N$ single crystal buffer layer, and the hexagonal $In_yGa_zAl_{1-y-z}N$ single crystal layer are ohmic junctions.

When energized, such an arrangement allows the resistance to be reduced to approximately 1/10 compared with the conventional one.

Or alternatively, it is preferable that each of the above-mentioned back electrode and the surface electrode is formed of a metal including at least one of Al, Ti, In, Au, Ni, Pt, W, and Pd, the back electrode is the ohmic junction, the surface electrode is the ohmic junction, and the above-mentioned 3C-SiC single crystal buffer layer, the hexagonal $In_wGa_xAl_{1-w-x}N$ single crystal buffer layer, and the hexagonal $In_yGa_zAl_{1-y-z}N$ single crystal layer are heterojunctions having an energy barrier.

Such an arrangement may ease the electric-field concentration and allow the breakdown voltage to be increased to three times the conventional one.

Furthermore, in the above-mentioned compound semiconductor device, it is preferable that two or more of the above-mentioned surface electrodes are formed, each of them is formed of a metal including at least one of Al, Ti, In, Au, Ni, Pt, W, and Pd, and these surface electrodes are Schottky junctions except that at least one of them is an ohmic junction.

Such an arrangement allows the 3C-SiC single crystal buffer layer and the Si single crystal substrate which have a high carrier concentration and are very conductive, to be used as an electrode, and the electric-field concentration to be eased, so that the breakdown voltage can be increased to four times the conventional one.

Furthermore, it is preferable that an insulating layer and an upper electrode are stacked in order on the above-mentioned surface electrode.

Such an arrangement allows the electric-field concentration to be eased further and the breakdown voltage to be increased to five times the conventional one.

Further, it is preferable that an area ratio of the above-mentioned surface electrode to each of the above-mentioned 3C-SiC single crystal buffer layer, hexagonal $In_wGa_xAl_{1-w-x}N$ single crystal buffer layer, and hexagonal $In_yGa_zAl_{1-y-z}N$ single crystal layer is 0.2-0.9.

By choosing the ratio of the surface electrode to each of the compound semiconductor layers to be 0.2-0.9, a device having a higher efficiency and a higher breakdown voltage can be provided.

BEST MODE FOR CARRYING OUT THE INVENTION

Figure 1:
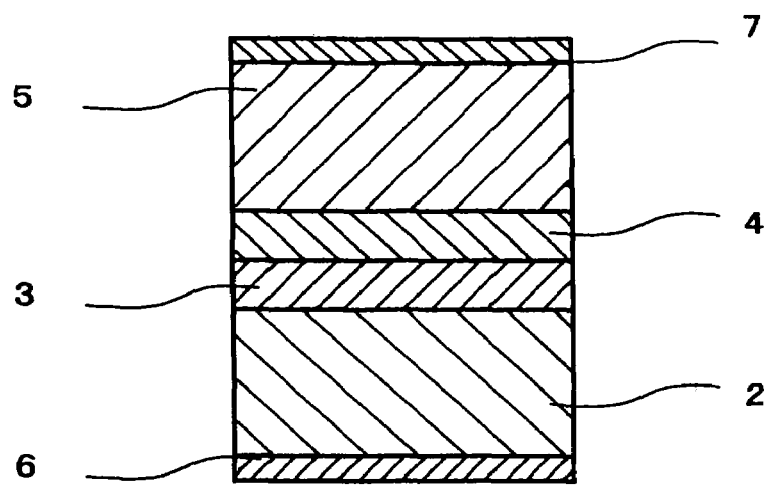
FIG. 1 is a sectional view conceptually showing a compound semiconductor device in accordance with Example 1.

Hereafter, the present invention will be described in detail.

A compound semiconductor in accordance with the present invention is arranged such that a 3C-SiC single crystal buffer layer, a hexagonal $In_wGa_xAl_{1-w-x}N$ single crystal buffer layer ($0 \leq w<1$, $0 \leq x<1$, $w+x<1$), and a hexagonal $In_yGa_zAl_{1-y-z}N$ single crystal layer ($0 \leq y<1$, $0<z \leq 1$, $y+z \leq 1$) are stacked in order on a Si single crystal substrate.

The buffer layers on the Si single crystal substrate are thus constituted by the 3C-SiC single crystal and the hexagonal $In_wGa_xAl_{1-w-x}N$ single crystal ($0 \leq w<1$, $0 \leq x<1$, $w+x<1$), so that the carrier concentration can be increased and the resistance can be substantially halved compared with the conventional one when energized.

As for the Si single crystal substrate in the present invention, not only one that is manufactured by the CZ (Czochralski) method, but also one that is manufactured by the FZ (floating zone) method and one in which a Si single crystal layer is epitaxially grown on the Si single crystal substrate by way of a vapor phase epitaxy (Si epitaxial substrate) can be used.

In addition, epitaxial growth can provide a single crystal layer (epitaxial layer) excellent in crystallinity, and has an advantage that a crystal-plane orientation of the substrate can be followed by the epitaxial layer.

As for the above-mentioned Si single crystal substrate, one that has the crystal-plane orientation {111} is used. Here, by the face orientation {111}, we include a little inclination (approximately ten and several degrees) of the crystal-plane orientation {111} or a crystal-plane orientation of high order plane indices, such as {211}.

Thus, by choosing the crystal-plane orientation {111}, the generation of the anti-phase boundary defect is reduced and the electric-field concentration in the defect can be eased, so that the breakdown voltage can be increased to 1.5 times the conventional one.

In addition, the anti-phase boundary is formed perpendicular to a crystal-plane orientation {100} which is at an angle of approximately 60 degrees relative to the crystal-plane orientation {111} and it is hard to reach the crystal surface. However, there are six crystal-plane orientations {100} which are crystallographically equivalent. For this reason, when the anti-phase boundaries collide with each other, pair annihilation takes place and generation of the anti-phase boundary decreases.

Further, since it is known that an anti-phase boundary generates on a surface of a Si single crystal substrate having an odd number of atomic steps, it is preferable that the 3C-SiC single crystal buffer layer is grown on a surface of a Si single crystal substrate having no atomic steps or an even number of atomic steps.

Such a surface of the Si single crystal substrate, as mentioned above, having no atomic steps or an even number of atomic steps is prepared by way of a heat treatment in hydrogen atmosphere, inactive gas, or decompression atmosphere. In this case, a heat treatment temperature is preferably 800-1400° C.

Where the above-mentioned heat treatment temperature is less than 800° C., it is chemically inactive, resulting in the Si single crystal substrate in which the surface has an atomic step or an odd number of atomic steps, and adversely affecting the next vapor phase epitaxy. On the other hand, if the above-mentioned heat treatment temperature exceeds 1400 C, the Si single crystal substrate melts and the next vapor phase epitaxy becomes difficult.

It is preferable that the heat treatment temperature in hydrogen atmosphere, inactive gas, or decompression atmosphere is 900-1300° C.

Further, as for the above-mentioned Si single crystal substrate, one having a carrier concentration of $10^{16}$-$10^{21}$/ $cm^3$ ($\cong$resistivity of 1-0.00001 $\Omega$cm) is used.

Where the above-mentioned carrier concentration is less than $10^{16}/cm^3$, the Si single crystal substrate has the high resistance, so that the energy loss increases when energized. On the other hand, the higher carrier concentration gives a better result, from a viewpoint of energy loss. However, it is physically difficult for the Si single crystal to exceed $10^{21}/cm^3$.

It is preferable that the minimum limit of the carrier concentration of the Si single crystal substrate is $10^{17}/cm^3$.

The thickness of the above-mentioned Si single crystal substrate is preferably 100-1000 μm, and more preferably 200-800 μm.

When the thickness of the Si single crystal substrate is less than 100 μm, it results in insufficient mechanical strength.

On the other hand, when the above-mentioned thickness exceeds 1000 μm, material costs become high and it cannot be said that effects for the costs can be obtained.

Further, the thickness of the 3C-SiC single crystal buffer layer formed on the above-mentioned Si single crystal substrate is arranged to be 0.05-2 μm.

When the thickness of the above-mentioned 3C-SiC single crystal buffer layer is less than 0.05 μm, the buffer effect is insufficient. On the other hand, if the above-mentioned thickness exceeds 2 μm, only the material costs are high.

It is more preferable that the thickness of the 3C-SiC single crystal buffer layer is 0.1-1 μm.

Further, a conductive type of the above-mentioned 3C-SiC single crystal buffer layer is n-type.

When conductive types are different, a pn-junction is formed near a boundary between the 3C-SiC single crystal buffer layer and the Si single crystal substrate, increasing the resistance and resulting in the energy loss when energized.

The carrier concentration of the above-mentioned 3C-SiC single crystal buffer layer is arranged to be $10^{16}$-$10^{21}$/cm$^3$.

Where the above-mentioned carrier concentration is less than $10^{16}$/cm$^3$, it has the high resistance, resulting in the energy loss when energized. On the other hand, the higher the above-mentioned carrier concentration is the better the result is, from a viewpoint of energy loss. However, it is physically difficult to exceed $10^{21}$/cm$^3$.

It is preferable that the minimum limit of the carrier concentration of the 3C-SiC single crystal buffer layer is $10^{17}$/cm$^3$.

The above-mentioned 3C-SiC single crystal buffer layer is formed by approximately 10 nm in thickness by way of a heat treatment in a carbon material atmosphere only, so that the formation is further carried out by way of a vapor phase epitaxy.

Further, by using monomethylsilane etc. a low-temperature SiC layer may beforehand be formed on the Si single crystal substrate surface, and may subsequently be subjected to the vapor phase epitaxy.

The temperature for the above-mentioned heat treatment and the vapor-phase-epitaxy temperature are preferably 800-1400° C.

The materials do not decompose when the above-mentioned temperature is less than 800° C., but the formation of the 3C-SiC single crystal buffer layer becomes difficult. On the other hand, if the above-mentioned temperature exceeds 1400° C., the Si single crystal substrate melts, so that the vapor phase epitaxy becomes difficult.

More preferably, the above-mentioned temperature is 900-1300° C.

Further, the carbon material used in the above-mentioned heat treatment need only include carbon, so that a gas material diluted with hydrogen etc., a liquid material, and a solid material may used. Examples of the above-mentioned gas material are $CH_4$ (methane), $C_2H_6$ (ethane), $C_4H_{10}$ (butane), $C_2H_2$ (acetylene), etc.

Further, examples of materials for vapor phase epitaxy are a gas material diluted with hydrogen etc., a liquid material, and a solid material. Examples of the above-mentioned gas material are hydrides: $SiH_4$ (monosilane), $Si_2H_6$ (disilane), $CH_4$, $C_2H_6$, $C_4H_{10}$, $C_2H_2$, etc., and halides: $SiH_2Cl_2$ (dichlorosilane), $SiHCl_3$ (trichlorosilane), etc.

The thickness of the above-mentioned 3C-SiC single crystal buffer layer is adjusted according to a material flow rate, a pressure, a temperature, and time.

Further, the carrier concentration of the above-mentioned 3C-SiC single crystal buffer layer is adjusted by adjusting the carrier concentration of the Si single crystal substrate or adding a dopant during the heat treatment and the vapor phase epitaxy.

As an n-type dopant element, N (nitrogen), P (phosphorus), Sb (antimony), As (arsenic), etc. are used. Examples of materials containing these elements are $N_2$ (nitrogen gas) and hydrides: $NH_3$ (ammonia), $PH_3$ (phosphine), arsenides: $AsH_3$, $As_2H_4$ (arsine), antimonides: $SbH_3$ (stibine), etc., which may be diluted with hydrogen etc. so as to produce a gas material, a liquid materials, and a solid material to be used.

In the above-mentioned compound semiconductor, it is preferable that the c-BP single crystal buffer layer is inserted and formed between the Si single crystal substrate and the 3C-SiC single crystal buffer layer. Preferably its thickness is 0.01-1 μm.

Where the above-mentioned thickness is less than 0.01 μm, a buffer effect and a resistance reduction effect of the c-BP single crystal buffer layer become insufficient. On the other hand, if the above-mentioned thickness exceeds 0.5 μm, only the material costs are high.

Further, the above-mentioned c-BP single crystal buffer layer is arranged to be n-type which is the same conductive type as that of the 3C-SiC single crystal buffer layer such that a pn-junction may not be formed near a boundary with 3C-SiC single crystal buffer layer.

If the pn-junction is formed, the resistance becomes high to produce the energy loss when energized.

It is preferable that the carrier concentration of the above-mentioned c-BP single crystal buffer layer is $10^{16}$-$10^{21}$/cm$^3$.

Where the above-mentioned carrier concentration is less than $10^{16}$/cm$^3$, it has the high resistance, resulting in the energy loss when energized. On the other hand, the higher the above-mentioned carrier concentration is the better the result is, from a viewpoint of energy loss. However, it is physically difficult to exceed $10^{21}$/cm$^3$.

It is preferable that the minimum limit of the carrier concentration of the c-BP single crystal buffer layer is $10^{17}$/cm$^3$.

Furthermore, the thickness of the hexagonal $In_wGa_xAl_{1-w-x}N$ single crystal buffer layer formed on the above-mentioned 3C-SiC single crystal buffer layer is arranged to be 0.01-0.5 μm.

Where the above-mentioned thickness is less than 0.01 μm, the buffer effect of the hexagonal $In_wGa_xAl_{1-w-x}N$ single crystal buffer layer becomes insufficient. On the other hand, if the above-mentioned thickness exceeds 0.5 μm, it has the high resistance, resulting in the energy loss when energized.

It is more preferable that the thickness of the hexagonal $In_wGa_xAl_{1-w-x}N$ single crystal buffer layer is 0.02-0.1 μm.

Furthermore, the thickness of the hexagonal $In_yGa_zAl_{1-y-z}N$ single crystal layer formed on the above-mentioned hexagonal $In_wGa_xAl_{1-w-x}N$ single crystal buffer layer is arranged to be 0.1-5 μm.

Where the above-mentioned thickness is less than 0.1 μm, a target device with the high breakdown voltage can not be obtained. On the other hand, if the above-mentioned thickness exceeds 5 μm, only the material costs are high.

It is more preferable that the thickness of the hexagonal $In_yGa_zAl_{1-y-z}N$ single crystal layer is 0.5-4 μm.

Further, a conductive type of the above-mentioned hexagonal $In_yGa_zAl_{1-y-z}N$ single crystal layer is n-type.

When conductive types are different, a pn-junction is formed near a boundary between the 3C-SiC single crystal buffer layer and the hexagonal $In_wGa_xAl_{1-w-x}N$ single crystal buffer layer, or between the hexagonal $In_wGa_xAl_{1-w-x}N$ single crystal buffer layer and the hexagonal $In_yGa_zAl_{1-y-z}N$ single crystal layer, increasing the resistance and resulting in the energy loss when energized.

Further, the carrier concentration of the hexagonal $In_yGa_zAl_{1-y-z}N$ single crystal layer is arranged to be $10^{11}$-$10^{16}$/cm$^3$ (≅resistivity of 1-100000 Ωcm).

Although the lower carrier concentration mentioned above gives the better result from a viewpoint of a compound semiconductor performance, it is physically difficult to be less than $10^{11}$/cm$^3$. On the other hand, if the above-mentioned carrier concentration exceeds $10^{16}$/cm$^3$, the hexagonal $In_yGa_zAl_{1-y-z}N$ single crystal layer suffers from the problem of being destroyed at a low voltage.

As the materials for vapor phase epitaxy for the hexagonal $In_wGa_xAl_{1-w-x}N$ single crystal buffer layer and the hexagonal $In_yGa_zAl_{1-y-z}N$ single crystal layer, a gas material diluted with hydrogen etc., a liquid material, and a solid material are used. Examples of the above-mentioned gas materials are $N_2$, hydrides: $NH_3$ etc, and examples of materials which have a methyl group are organic substances: TMA (trimethylaluminum), TMI (trimethilindium), TMG (trimethylgallium), TEG (tirethylgallium), TMH (trimethylhydrazine), etc.

The thicknesses of the above-mentioned hexagonal $In_wGa_xAl_{1-w-x}N$ single crystal buffer layer and the hexagonal $In_yGa_zAl_{1-y-z}N$ single crystal layer are adjusted according to a material flow rate, a pressure, a temperature, and time.

Further, the carrier concentrations of the above-mentioned hexagonal $In_wGa_xAl_{1-w-x}N$ single crystal buffer layer and the hexagonal $In_yGa_zAl_{1-y-z}N$ single crystal layer are adjusted by adding the dopant during the vapor phase epitaxy.

A material containing Si such as $SiH_4$, $Si2H_6$, $SiH_2Cl_2$, $SiHCl_3$, etc. can be used as an n-type dopant.

In addition, when decreasing the carrier concentration especially, it can be adjusted by not adding the dopant during the vapor phase epitaxy.

Because of the same reason as that for the above-mentioned SiC single crystal buffer layer, vapor-phase-epitaxy temperatures of the above-mentioned hexagonal $In_wGa_xAl_{1-w-x}N$ single crystal buffer layer and the hexagonal $In_yGa_zAl_{1-y-z}N$ single crystal layer are preferably 800-1400° C., and more preferably 900-1300° C.

In the above-mentioned compound semiconductor, it is preferable that the above-mentioned hexagonal $In_wGa_xAl_{1-w-x}N$ single crystal buffer layer is the hexagonal AlN (w=0, x=0) and the above-mentioned hexagonal $In_yGa_zAl_{1-y-z}N$ single crystal layer is the hexagonal GaN (y=0, z=1).

Lattice constants of the 3C-SiC single crystal buffer layer, the hexagonal AlN, and the hexagonal GaN are respectively 3.083 Å (a-axis conversion), 3.112 Å, and 3.18 Å, which change stepwise and have small lattice mismatch, so that the misfit dislocation caused by the lattice mismatch can be reduced, the electric-field concentration to misfit dislocation is reduced, and the breakdown voltage can be doubled compared with the conventional one.

Further, the compound semiconductor device in accordance with the present invention is characterized in that the back electrode is formed in the back of the Si single crystal substrate of the compound semiconductor as mentioned above in accordance with the present invention, and the surface electrode is formed on the surface of the hexagonal $In_yGa_zAl_{1-y-z}N$ single crystal layer.

It is preferable that each of the back electrode formed in the back of the above-mentioned Si single crystal substrate, and the surface electrode formed on the above-mentioned hexagonal $In_yGa_zAl_{1-y-z}N$ single crystal layer is formed of a metal including at least one of Al, Ti, In, Au, Ni, Pt, W. and Pd.

Further, by arranging for the back electrode to be the ohmic junction, for the surface electrode to be the Schottky junction, and for the 3C-SiC single crystal buffer layer, the hexagonal $In_wGa_xAl_{1-w-x}N$ single crystal buffer layer, and the hexagonal $In_yGa_zAl_{1-y-z}N$ single crystal layer to be the ohmic junctions, the device with the high efficiency and the high breakdown voltage can be obtained.

Or alternatively, as for junctions of each layer and electrodes as mentioned above, when the surface electrode is arranged to be the ohmic junction and the 3C-SiC single crystal buffer layer, the hexagonal $In_wGa_xAl_{1-w-x}N$ single crystal buffer layer, and the hexagonal $In_yGa_zAl_{1-y-z}N$ single crystal layer are arranged to be heterojunctions having an energy barrier, the 3C-SiC single crystal buffer layer and the Si single crystal substrate which have the high carrier concentration and are very conductive can be used as electrodes, so that the device with the high efficiency and the high breakdown voltage can be obtained.

Furthermore, two or more of the above-mentioned surface electrodes are formed. Even if they are arranged to be the Schottky junctions (except that at least one of these surface electrodes is the ohmic junction), the device with the high efficiency and the high breakdown voltage is similarly obtained.

Further, by stacking an insulating layer and an upper electrode in order on the above-mentioned surface electrode, the device with the higher efficiency and the higher breakdown voltage can be obtained.

In addition, the formation of the insulating layer can be performed by way of a CVD method, an insulator applying method, etc. Further, the formation of the upper electrode can be performed by way of vacuum deposition, an electron-ray-gun heating method, etc.

Furthermore, it is preferable that an area of the above-mentioned surface electrode is smaller than each area of the 3C-SiC single crystal buffer layer, the hexagonal $In_wGa_xAl_{1-w-x}N$ single crystal buffer layer, and the hexagonal $In_yGa_zAl_{1-y-z}N$ single crystal layer, as the compound semiconductor layers. In particular, it is more preferable that each of these area ratios (area of the surface electrode/each area of the compound semiconductor layers) is 0.2-0.9 from a viewpoint of obtaining the device with the high efficiency and the high breakdown voltage.

In addition, the adjustment of the area of the surface electrode can be carried out by way of micro fabrication by lithography and metal masking which are performed in usual semiconductor device manufacture.

EXAMPLES

Hereafter, the present invention will be described more particularly based on Examples, but the present invention is not limited the following Examples.

Example 1

A conceptual sectional view of a compound semiconductor device in accordance with the present Example is shown in FIG. 1.

A compound semiconductor device 1 as shown in FIG. 1 is arranged such that an n-type 3C-SiC single crystal buffer layer 3 having a thickness of 1 μm and a carrier concentration of $10^{17}$/cm$^3$, an hexagonal AlN (w=0, x=0) as a hexagonal $In_wGa_xAl_{1-w-x}N$ single crystal buffer layer 4 having a thickness of 0.02 μm, and a hexagonal GaN (y=0, z=1) as an n-type hexagonal $In_yGa_zAl_{1-y-z}N$ single crystal layer 5 having a thickness of 4 μm and a carrier concentration of $10^{15}/cm^3$ (≅resistivity of 10 Ωcm) are stacked in order on an n-type Si single crystal substrate 2 having a crystal-plane orientation {111}, a carrier concentration of $10^{17}/cm^3$ (≅resistivity of 0.1 Ωcm), and a thickness of 400 μm, as well as a back electrode 6 is formed in the back of the Si single crystal substrate 2 and a surface electrode 7 is formed on the surface of the hexagonal $In_yGa_zAl_{1-y-z}N$ single crystal layer 4.

Hereafter, a manufacturing process of this compound semiconductor device 1 will be described.

At first, the n-type Si single crystal substrate 2 having the crystal-plane orientation {111}, the carrier concentration of $10^{17}/cm^3$, and the thickness of 400 μm and manufactured by the CZ method was heat-treated at 1000° C. in a hydrogen atmosphere, and the surface was cleaned.

The above-mentioned Si single crystal substrate 2 was heat-treated at 1000° C. in a $C_3H_8$ source-gas atmosphere, so that the n-type 3C-SiC single crystal buffer layer 3 having a thickness of 10 nm and a carrier concentration of $10^{17}/cm^3$ was formed.

Then, by using $SiH_4$ gas and $C_3H_8$ gas as source gases and by way of vapor phase epitaxy at 1000° C., the n-type 3C-SiC single crystal buffer layer 3 having the thickness of 1 μm and the carrier concentration of $10^{17}/cm^3$ was further stacked on the above-mentioned 3C-SiC single crystal buffer layer 3, to obtain a desired thickness.

In addition, the thickness of the 3C-SiC single crystal buffer layer 3 was adjusted according to a flow rate of the source gas and time. Further, the carrier concentration was adjusted by adding $N_2$ as a dopant during the vapor phase epitaxy.

Next, by using TMA gas and $NH_3$ gas as source gases and by way of the vapor phase epitaxy at 1000° C., the hexagonal AlN (w=0, x=0) as the hexagonal $In_wGa_xAl_{1-w-x}N$ single crystal buffer layer 4 having the thickness of 0.02 μm was stacked on the above-mentioned 3C-SiC single crystal buffer layer 3.

Furthermore, by using TMG gas and $NH_3$ gas as source gases and by way of the vapor phase epitaxy at 1000° C., the hexagonal GaN (y=0, z=1) as then-type hexagonal $In_yGa_zAl_{1-y-z}N$ single crystal layer 5 having the thickness of 4 μm and the carrier concentration of $10^{15}/cm^3$ (≅resistivity of 10 Ωcm) was stacked on the hexagonal AlN single crystal buffer layer 4.

In addition, the thicknesses of the hexagonal AlN single crystal buffer layer 4 and the hexagonal GaN single crystal layer 5 were adjusted according to the material flow rate and time. Further, the carrier concentration was adjusted to be low by not adding the dopant during the heat treatment.

Finally, the back electrode 6 was formed by way of vacuum deposition of Al, and the surface electrode 7 was formed by way of vacuum deposition of Au. The ohmic junctions and Schottky junction of these electrodes were adjusted by way of the heat treatment.

Further, the ohmic junctions of the 3C-SiC single crystal buffer layer 3, the hexagonal $In_wGa_xAl_{1-w-x}N$ single crystal buffer layer 4, and the hexagonal $In_yGa_zAl_{1-y-z}N$ single crystal layer 5 were adjusted according to a composition (w, x, y, z) of each layer.

The compound semiconductor device 1 obtained by way of the above-mentioned manufacturing process was subjected to measurements of the resistance and the breakdown voltage, so that the resistance was decreased to approximately 1/100 of the conventional one and the breakdown voltage was increased to approximately twice the conventional one, thus being sufficiently practical.

Example 2

Figure 2:
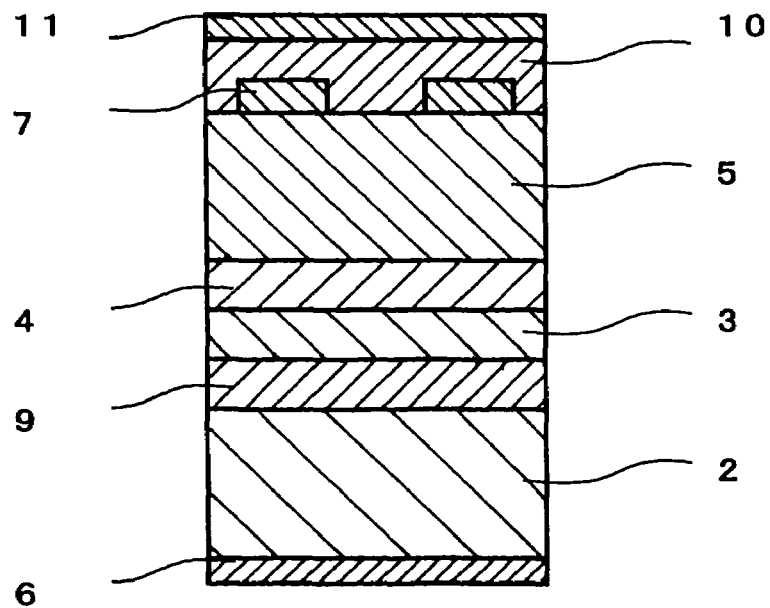
FIG. 2 is a sectional view conceptually showing a compound semiconductor device in accordance with Example 2.

A conceptual sectional view of a compound semiconductor device in accordance with the present Example is shown in FIG. 2.

A compound semiconductor device 8 as shown in FIG. 2 is arranged such that an n-type c-BP single crystal buffer layer 9 having a thickness of 0.5 μm and a carrier concentration of $10^{16}$-$10^{21}/cm^3$ the n-type 3C-SiC single crystal buffer layer 3 having the thickness of 1 μm and the carrier concentration of $10^{17}/cm^3$, the hexagonal AlN (w=0, x=0) as the hexagonal $In_wGa_xAl_{1-w-x}N$ single crystal buffer layer 4 having the thickness of 0.02 μm, and the hexagonal GaN (y=0, z=1) as the n-type hexagonal $In_yGa_zAl_{1-y-z}N$ single crystal layer 5 having the thickness of 4 μm and the carrier concentration of $10^{15}/cm^3$ (≅resistivity of 10 Ωcm) are stacked in order on the n-type Si single crystal substrate 2 having the crystal-plane orientation {111}, the carrier concentration of $10^{17}/cm^3$ (≅resistivity of 0.1 Ωcm), and the thickness of 400 μm, as well as the back electrode 6 is formed in the back of the Si single crystal substrate 2, a plurality of surface electrodes 7 are stacked on the surface of the hexagonal $In_yGa_zAl_{1-y-z}N$ single crystal layer 5, and an insulating layer 10 and an upper electrode 11 are stacked in order on the surface electrodes 7.

Hereafter, a manufacturing process of this compound semiconductor device 8 will be described.

At first, by using $PH_3$ gas and $B_2H_6$ gas as source gases and by way of the vapor phase epitaxy at 1000° C., the n-type c-BP single crystal buffer layer 9 having the thickness of 0.5 μm and the carrier concentration of $10^{17}/cm^3$ was stacked on the Si single crystal substrate 2 cleaned as in Example 1. In addition, the thickness of the c-BP single crystal buffer layer 9 was adjusted according to the flow rate of the source gases and time. Further, the carrier concentration was adjusted according to the flow rate of the source gases.

Next, by using $SiH_4$ gas and $C_3H_8$ gas as source gases and by way of the vapor phase epitaxy at 1000° C., the n-type 3C-SiC single crystal buffer layer 3 having the thickness of 1 μm and the carrier concentration of $10^{17}/cm^3$ was stacked on the above-mentioned c-BP single crystal buffer layer 9.

In addition, the thickness of 3C-SiC single crystal buffer layer 3 was adjusted according to the flow rate of the source gases and time. Further, the carrier concentration was adjusted by adding $N_2$ as a dopant during the vapor phase epitaxy.

Subsequently, the hexagonal AlN (w=0, x=0) as the hexagonal $In_wGa_xAl_{1-w-x}N$ single crystal buffer layer 4 and the hexagonal GaN (y=0, z=1) as the n-type hexagonal $In_yGa_zAl_{1-y-z}N$ single crystal layer 5 were stacked in order as in Example 1.

Next, the back electrode 6 was formed by way of the vacuum deposition of Al, and the plurality of surface electrodes 7 were formed by carrying out the vacuum depositions of Al and Au separately. The ohmic junctions and the Schottky junction of these electrodes were adjusted by way of the heat treatment.

Further, the ohmic junctions of the 3C-SiC single crystal buffer layer 3, the hexagonal $In_wGa_xAl_{1-w-x}N$ single crystal buffer layer 4, and the hexagonal $In_yGa_zAl_{1-y-z}N$ single crystal layer 5 were adjusted according to the composition (w, x, y, z) of each layer.

Finally, the insulating layer 10 and the upper electrode 11 were stacked in order on the above-mentioned surface electrode 7. The compound semiconductor device 8 obtained by way of the above-mentioned manufacturing process was subjected to measurements of the resistance and the breakdown voltage, so that the resistance was decreased to approximately 1/200 of the conventional one and the breakdown voltage was increased to approximately five times the conventional one, thus being sufficiently practical.

As described above, according to the semiconductor compound in accordance with the present invention, the carrier concentration of the buffer layer can be increased, the resistance can be decreased, and the energy loss in the device can be reduced.

Further, the compound semiconductor device in accordance with the present invention can ease the electric-field concentration, and be suitably used as a Schottky barrier diode etc., because of the high efficiency and the high breakdown voltage.

The invention claimed is:

1. A compound semiconductor device in which a back electrode is formed on a back of an n-type Si single crystal substrate of the compound semiconductor device in which an n-type 3C-SiC single crystal buffer layer having a thickness of 0.05-2 μm and a carrier concentration of $10^{16}$-$10^{21}$/cm$^3$, a hexagonal $In_wGa_xAl_{1-w-x}N$ single crystal buffer layer having a thickness of 0.01-0.5 μm ($0 \leq W<1$, $0 \leq X<1$, $W+X<1$), and an n-type hexagonal $In_yGa_zAl_{1-y-z}N$ single crystal layer ($0 \leq Y<1$, $0<Z \leq 1$, $Y+Z \leq 1$) having a thickness of 0.1-5 μm and a carrier concentration of $10^{11}$-$10^{16}$/cm$^3$ are stacked in order on an n-type Si single crystal substrate having a crystal-plane orientation {111} and a carrier concentration of $10^{16}$-$10^{21}$/cm$^3$, and a surface electrode is formed on a surface of the hexagonal $In_yGa_zAl_{1-y-z}N$ single crystal layer, and wherein an insulating layer is formed on a surface of the surface electrode and the surface of the hexagonal $In_yGa_zAl_{1-y-z}N$, and an upper electrode is stacked on said insulating layer.

2. A compound semiconductor device as claimed in claim 1, wherein said back electrode and surface electrode are each formed of a metal including at least one of Al, Ti, In, Au, Ni, Pt, W, and Pd, the back electrode is an ohmic electrode and the surface electrode is a Schottky electrode, and ohmic junctions formed between hexagonal $In_wGa_xAl_{1-w-x}N$ single crystal buffer layer, and hexagonal $In_yGa_zAl_{1-y-z}N$ single crystal layer when $W=Y$, $X=Z$.

3. A compound semiconductor device as claimed in claim 1, wherein said back electrode and surface electrode are each formed of a metal including at least one of Al, Ti, In, Au, Ni, Pt, W, and Pd, the back electrode is an ohmic electrode, the surface electrode is an ohmic electrode, and heterojunctions form between hexagonal $In_wGa_xAl_{1-w-x}N$ single crystal buffer layer, and hexagonal $In_yGa_zAl_{1-y-z}N$ single crystal layer when $W \neq Y$, $X \neq Z$.

4. A compound semiconductor device as claimed in claim 1, wherein at least two of said surface electrodes are provided and each formed of a metal including at least one of Al, Ti, In, Au, Ni, Pt, W, and Pd, and wherein at least one of the surface electrode is an ohmic electrode and the remaining surface electrode is a Schottky electrode.

5. A compound semiconductor device as claimed in claim 1, wherein an area ratio of said surface electrode to each of said 3C-SiC single crystal buffer layer, hexagonal $In_wGa_xAl_{1-w-x}N$ single crystal buffer layer, and hexagonal $In_yGa_zAl_{1-y-z}N$ single crystal layer is 0.2-0.9.

* * * * *